(12) United States Patent
Niu et al.

(10) Patent No.: US 12,216,537 B2
(45) Date of Patent: Feb. 4, 2025

(54) ERROR DETECTION, PREDICTION AND HANDLING TECHNIQUES FOR SYSTEM-IN-PACKAGE MEMORY ARCHITECTURES

(71) Applicant: Alibaba Group Holding Limited, Grand Cayman (KY)

(72) Inventors: Dimin Niu, Sunnyvale, CA (US); Tianchan Guan, Shanghai (CN); Hongzhong Zheng, Los Gatos, CA (US); Shuangchen Li, Sunnyvale, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 18/035,498

(22) PCT Filed: Nov. 4, 2020

(86) PCT No.: PCT/CN2020/126346
§ 371 (c)(1),
(2) Date: May 4, 2023

(87) PCT Pub. No.: WO2022/094776
PCT Pub. Date: May 12, 2022

(65) Prior Publication Data
US 2024/0020194 A1    Jan. 18, 2024

(51) Int. Cl.
*G06F 11/10*    (2006.01)
*G11C 7/04*    (2006.01)

(52) U.S. Cl.
CPC ............ *G06F 11/1044* (2013.01); *G11C 7/04* (2013.01)

(58) Field of Classification Search
CPC .............................. G06F 11/1044; G11C 7/04
See application file for complete search history.

(56) References Cited

U.S. PATENT DOCUMENTS

| | | |
|---|---|---|
| 6,868,022 B2 | 3/2005 | Scheuerlein et al. |
| 7,870,472 B2 | 1/2011 | Thorp et al. |
| 8,063,650 B2 | 11/2011 | Ong et al. |
| 8,526,241 B2 | 9/2013 | Shirakawa |
| 8,848,905 B1 | 9/2014 | Hamlet et al. |
| 9,147,474 B2 | 9/2015 | Shirakawa |
| 9,940,457 B2 | 4/2018 | Healy et al. |

(Continued)

FOREIGN PATENT DOCUMENTS

| | | |
|---|---|---|
| CN | 105874434 A | 8/2016 |
| EP | 2587362 B1 | 10/2018 |

*Primary Examiner* — Samir W Rizk

(57) ABSTRACT

A system-in-package including a logic die and one or more memory dice can include a reliability availability serviceability (RAS) memory management unit (MMU) for memory error detection, memory error prediction and memory error handling. The RAS MMU can receive memory health information, on-die memory error information, system error information and read address information for the one or more memory dice. The RAS MMU can manage the memory blocks of the one or more memory dice based on the memory health information, on-die memory error type, system error type and read address. The RAS MMU can also further manage the memory blocks based on received on-die memory temperature information and or system temperature information.

20 Claims, 6 Drawing Sheets

(56) References Cited

U.S. PATENT DOCUMENTS

| | | |
|---|---|---|
| 2004/0190357 A1 | 9/2004 | Scheuerlein et al. |
| 2008/0184065 A1 | 7/2008 | Thorp et al. |
| 2012/0182803 A1 | 7/2012 | Shirakawa |
| 2012/0188830 A1 | 7/2012 | Jeong |
| 2013/0212431 A1 | 8/2013 | Ong |
| 2013/0227344 A1 | 8/2013 | Sohn et al. |
| 2015/0098273 A1 | 4/2015 | Shirakawa |
| 2015/0155055 A1 | 6/2015 | Kim et al. |
| 2015/0278551 A1 | 10/2015 | Iyer et al. |
| 2016/0055056 A1 | 2/2016 | Son et al. |
| 2017/0269852 A1* | 9/2017 | Lin .................... G06F 11/1044 |
| 2017/0269989 A1 | 9/2017 | Kim |
| 2019/0347158 A1 | 11/2019 | Chung et al. |
| 2020/0210352 A1 | 7/2020 | Kinsley |
| 2020/0371873 A1* | 11/2020 | Schaefer ............. G11C 11/2275 |
| 2022/0222117 A1* | 7/2022 | Kutch .................. G06F 9/5005 |
| 2023/0032668 A1* | 2/2023 | Kinsley ............... G06F 11/1004 |
| 2024/0020194 A1* | 1/2024 | Niu ..................... G06F 11/1044 |

\* cited by examiner

ERROR DETECTION, PREDICTION AND HANDLING TECHNIQUES FOR SYSTEM-IN-PACKAGE MEMORY ARCHITECTURES

BACKGROUND OF THE INVENTION

To provide for further scaling of integrated circuits (ICs), reduced memory access and or increased processing speed, and number of technologies have emerged that combine memory and logic circuits in two or three-dimensional architectures. Referring now to FIGS. 1A-1E a few exemplary two and three-dimensional architectures are illustrated. A two-dimensional (2D) processing-near-memory PNM IC package is illustrated in FIG. 1A. The 2D PNM 105 can include a memory die 110 and a logic die 115 coupled together in a single package. A 2D processing-in-memory (PIM) package is illustrated in FIG. 1B. The 2D PIM 120 can include both computation logic and memory on the same die 125. A 2.5D PNM package is illustrated in FIG. 1C. The 2.5D PNM 130 includes a memory die 110 and a logic die 115 coupled together by an interposer 145. A 3D hybrid PNM package 150 is illustrated in FIG. 1D. The 3D hybrid PNM 150 can include a memory die 155 coupled to a logic die 160. A 3D through-silicon-via (TSV) PNM package is illustrated in FIG. 1E. The 3D TSV PNM 165 can include a plurality of memory dice 170-180 coupled to a logic die 185 by a plurality of through-silicon-vias 190.

The reliability of the memory in two and three-dimensional architectures can be impacted by factors, including but not limited, operating temperatures in the package, bonding of the logic die to the one or more memory dice, and scaling of the one or more die. Therefore, there is a need for error detection, error prediction and or error handling techniques in two and three-dimensional PNM, PIM and the like architectures.

SUMMARY OF THE INVENTION

The present technology may best be understood by referring to the following description and accompanying drawings that are used to illustrate embodiments of the present technology directed toward processing-near-memory (PNM) architectures with memory error detection, error prediction and error handling mechanisms.

In one embodiment, a system-in-package (SiP) can include one or more memory dice and a logic die. The one or more memory dice can include respective memory arrays arranged in a plurality of blocks, an electronic fuse (eFuse) module and D-Flag register. The eFuse can be configured to store memory health information of the one or more memory dice. The D-Flag register can be configured to store on-die memory error information of the one or more memory dice. The logic die can include computation logic, a memory controller and a reliability availability serviceability (RAS) memory management unit (MMU). The memory controller can include a S-Flag register configured to store system memory error information and a read address buffer configured to store memory read addresses. The RAS MMU can be configured to manage memory error detection, memory error prediction and memory error handling based on the eFuse module, the memory error correcting code (ECC) flag register, the system error correcting code (ECC) flag register and the read address buffer.

In another embodiment, a method of manage memory error detection, memory error prediction and memory error handling can include receiving, by a memory management unit (MMU) of a logic die in a system-in-package (SIP), memory health information, on-die memory error information, system error information and read address information for one or more memory dice in the SIP. The method can further include managing, by the MMU, memory blocks of the one or more memory dice based on the memory health information, on-die memory error type, system error type and read address.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
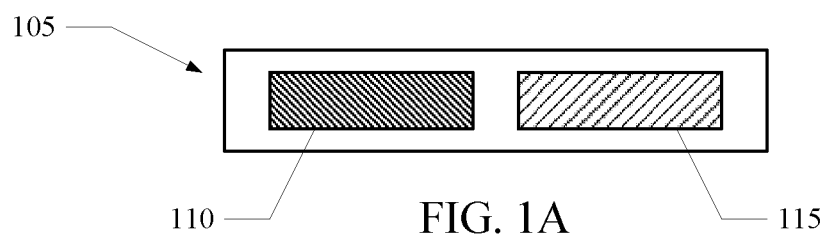
FIGS. 1A-1E illustrate exemplary two and three-dimensional PNM and PIM architectures.
Figure 1B:
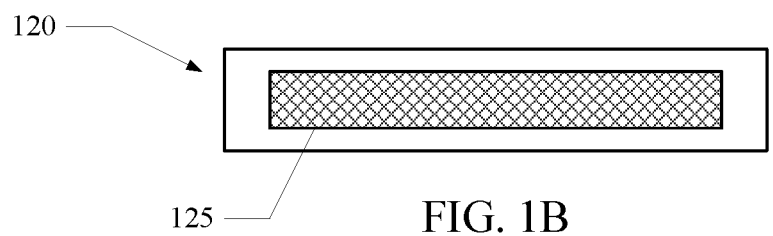
Figure 1C:
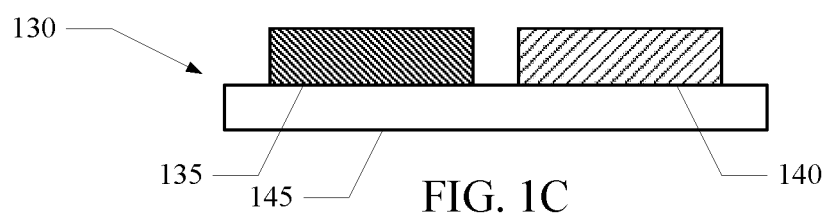
Figure 1D:
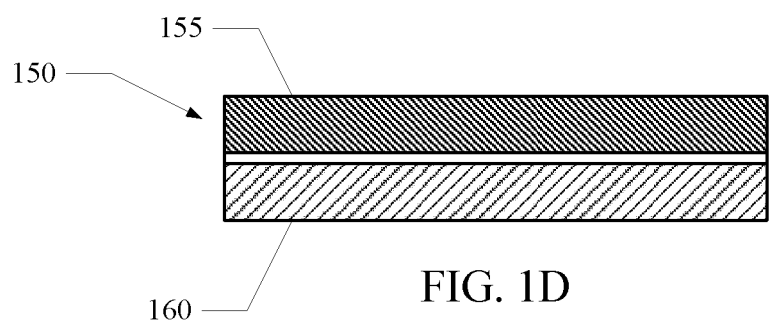
Figure 1E:
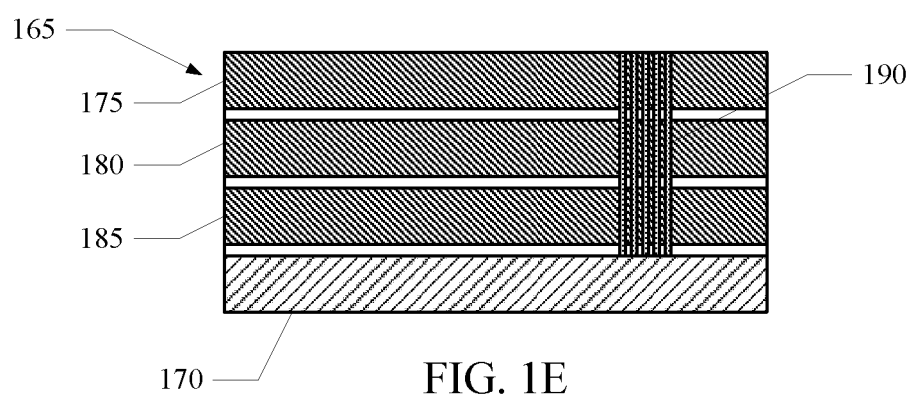

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Figure 2:
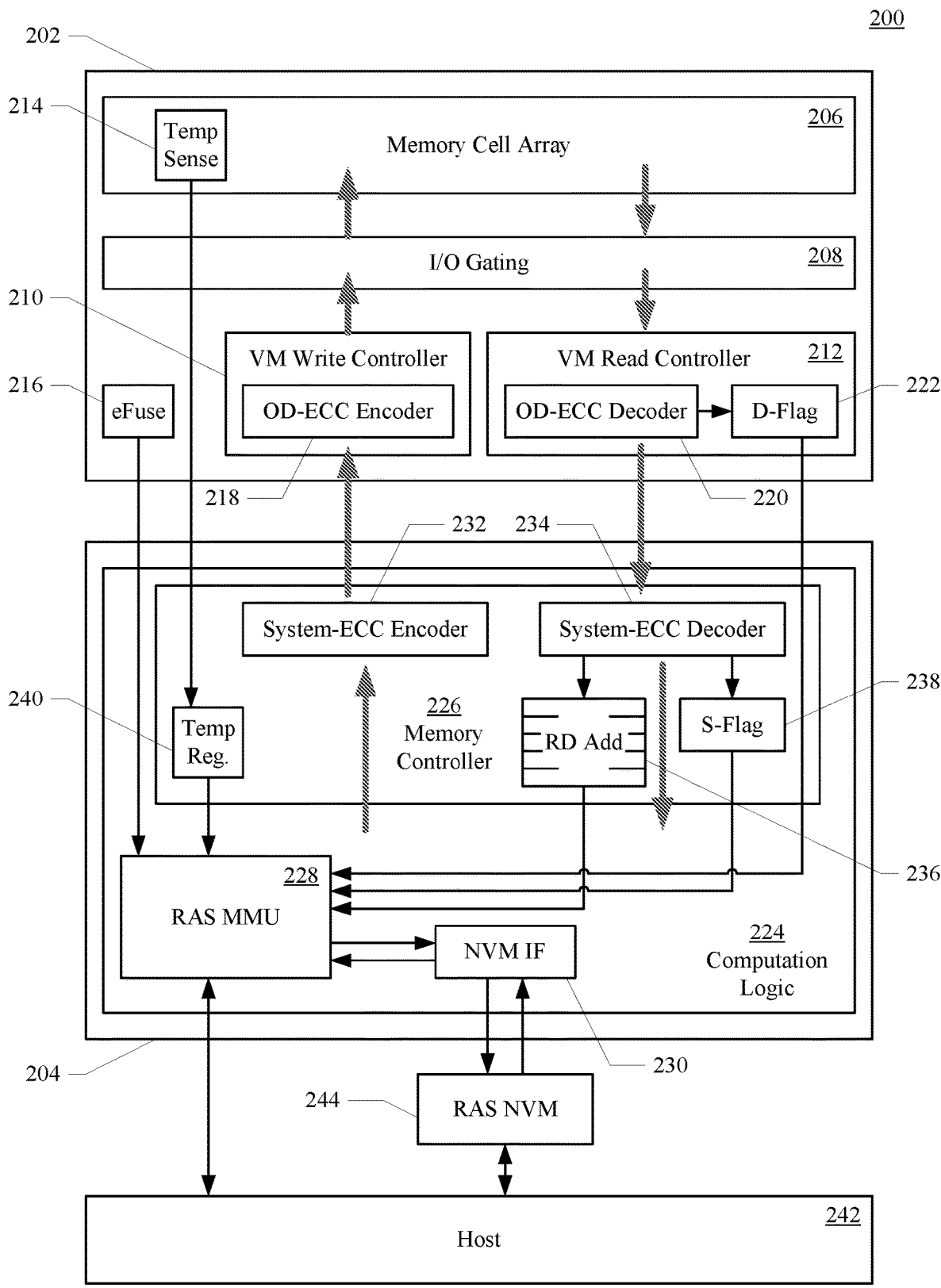
FIG. 2 shows a system-in-package (SiP), in accordance with aspects of the present technology.

Referring to FIG. 2, a system-in-package (SiP), in accordance with aspects of the present technology, is shown. The PNM SiP 200 can include one or more memory dice 202 coupled to a logic die 204 by one or more interfaces. The one or more memory dies 202 and the logic die 204 can be arranged in a processing-near-memory (PNM), 2D PNM, 2.5D PNM, processing-in-memory (PIM), 2D PIM, 3D Hybrid (HB) PNM, 3D through-silicon-via (TSV) PNM, or the like architecture. In one implementation, the one or more memory dice 202 can be volatile memory (VM) memory such as, but not limited to, dynamic random-access memory (DRAM). In one implementation, the logic die can include, but is not limited to, one or more processors, one or more controllers, one or more combinational logic circuits, one or more programmable gate arrays, one or more engines and the like, and any combinations thereof.

The one or more memory dice 202 can include, but is not limited to, a VM cell array 206, input/output (I/O) gating circuitry 208, VM write control logic 210, VM read control logic 212, memory array temperature sensor 214 and electronic fuses (eFuse) 216.

The VM cell array 206 can include a plurality of VM cells coupled in columns and rows by wordlines and bitlines for storing data in the VM cells. The VM cells of the array 206 can be arranged in a plurality of memory blocks. The I/O gating circuitry 208 can be configured to drive the wordlines and bitlines and sense currents or voltage thereon to read or write data to VM cells within selected blocks of the memory cell array 206. The VM write control logic 210 can be configured to control the I/O gating circuitry 208 to write data to VM cells within selected blocks of the memory cell array 206. Similarly, the VM read control logic 212 can be configured to control the I/O gating circuitry 208 to read data from VM cells within selected blocks of the memory cell array 206.

The VM write control logic 210 can include an on-on-die memory error correcting code (OD-ECC) encoder 218 configured to generate error detection and correction codes for data being written to VM cells with selected blocks, that can be utilized to detect errors and to correct at least some detected errors that occur in the process of writing data, as a result of one or more faulty VM cells, and or the in the process of reading the data. The VM read control logic 212 can include an OD-ECC decoder 220 and data flag (D-Flag) register 222. The OD-ECC decoder 220 can be configured to detect errors and to correct at least some detected errors utilizing the ECC codes generated by the OD-ECC encoder 218. In one implementation, the OD-ECC decoder 218 can detect both correctable and uncorrectable on-memory die bit errors, and can correct the correctable on-memory die bit errors. For example, a given ECC code can be configured to detect up to two bit errors in a word, and correct a single bit error in a word. The OD-ECC decoder 234 can be configured to set the D-Flag register 222 to indicate if a read operation for a given read address resulted in detection of a correctable or uncorrectable on-memory die bit error. For example, a first state of the D-Flag register can indicate a correctable error and a second state can indicate an uncorrectable error.

The memory array temperature sensor 214 can be disposed in the memory cell array 206 and be configured to sense an operating temperature of the memory cell array 206. Generally, as the operating temperature of the memory cell array 206 increases the rate of data errors in the memory cell array 206 also increases. The eFuse 216 can be configured to store health information of the respective one or more memory dice 202.

The logic die 204 can include computation logic 224, a memory controller 226, a reliability availability serviceability (RAS) memory management unit (MMU) 228 and non-volatile memory (NVM) interface 230. The computation logic 224 can include, but is not limited to, processors controllers, combinational logic circuits, programmable gate arrays, engines, and the like. The memory controller 226 can include a system-ECC encoder 232, a system-ECC decoder 234, a read address buffer 236, a system flag (S-Flag) register 238, and temperature register 240. The system-ECC encoder 232 can be configured to generate error detection and correction codes for data being sent to the one or more memory dice 202. The system-ECC decoder 234 can be configured to detect errors and to also correct at least some detected errors utilizing the ECC codes generated by the system-ECC encoder 232. In one implementation, the system-ECC decoder 234 can detect both correctable and uncorrectable system bit errors, and can correct the correctable system bit errors. For example, a given ECC code can be configured to detect up to two bit errors in a word and correct a single bit error in a word. The system-ECC decoder 234 can be configured to set the S-Flag register 238 to indicate if a read operation for a given read address resulted in detection of a correctable or uncorrectable system bit error. For example, a first state of the S-Flag register can indicate a correctable error and a second state can indicate an uncorrectable error.

The read address buffer 236 can be configured to hold the read addresses of read commands sent to the one or more memory dice 202. The temperature register 240 can be disposed in the memory controller 226 portion of the logic die 204 and be configured to store an operating temperature sensed by the temperature sensor 214 of the memory cell array 206. The RAS MMU 228 can be configured to communicatively couple the memory controller to a host 242. The RAS MMU 228 can be configured to manage memory error detection, memory error prediction and or memory error handling based on the eFuse 216, the D-Flag, the S-Flag, the read address buffer 236, and temperature sensed by the memory array temperature sensor 214 and stored in the temperature register 240 or optionally directly from the memory array temperature sensor 214. The NVM interface can be configured to communicatively couple the RAS MMU 228 to a reliability availability serviceability (RAS) non-volatile memory (NVM) 244. The RAS NVM 244 can be configured to store memory management information received from the RAS MMU 228. In one implementation, the RAS NVM 244 can be Flash memory. The RAS NVM 244 can also be communicatively coupled to the host 242. The memory management information stored in the RAS NVM 244 can also be read by the host 242.

In one implementation, the RAS MMU 228 can be coupled, by a respective interface, to the eFuse 216 of respective one of the one or more memory dice. The RAS MMU 228 can be configured to read health information of a respective memory die from a respective eFuse 216. In one implementation, the RAS MMU 228 can also be coupled, by a respective interface, to the D-Flag register 222. The RAS MMU 228 can be configured to read on-die ECC information from the D-Flag register 222 of the VM read control logic 212. In one implementation, the RAS MMU 228 can also be coupled, by a respective interface to, the S-Flag register 238. The RAS MMU 228 can be configured to read system ECC information from the S-Flag register 238. In one implementation, the RAS MMU 228 can also be coupled, by a respective interface, to the read address buffer 236. The RAS MMU 228 can be configured to read the address of a pending read operation from the read address buffer 236. The RAS MMU 228 can also be coupled, by a respective interface, to the temperature register 240 or optionally to the memory array temperature sensor 214. The RAS MMU 228 can be configured to read temperature information from the temperature register 240 or optionally directly from the memory array temperature sensor 214. The RAS MMU 228 can, in one implementation, detect and manage memory errors based on the information from the eFuse register 216, the D-Flag register 222, the S-Flag register 238 and the read address buffer 236. The RAS MMU 228 can also predict memory errors based on temperature information from the temperature register 240 or optionally directly from the memory array temperature sensor 214.

The RAS MMU 228 can report un-correctable system memory errors to the host 242. In one implementation, if a host application associated with the read request resulting in the un-correctable system memory error is error tolerant, the host 242 can be configured to acknowledge the un-correctable system memory error and continue execution of the host application without any other action. If the host application is not error tolerant, the host application can receive an un-correctable system memory error event notification from the host 242 for graceful exit by the host application. The host 242 can also be configured to send an acknowledgement of the report of the un-correctable system memory error back to the RAS MMU 228. If the RAS MMU 228 does not receive an acknowledgement back from the host 242 of the un-correctable system memory error, the MMU 228 can be configured to blacklist the associated memory block during runtime operation. If an acknowledgement of the report of the un-correctable system memory error is received by from the host 242, the RAS MMU 228 can blacklist the associated memory block at a next reset or power cycle event. If a blacklist of the associated memory block is not caused by an un-correctable system memory error, the RAS MMU 228 can blacklist the associated memory block at a next reset or power cycle event.

Figure 3:
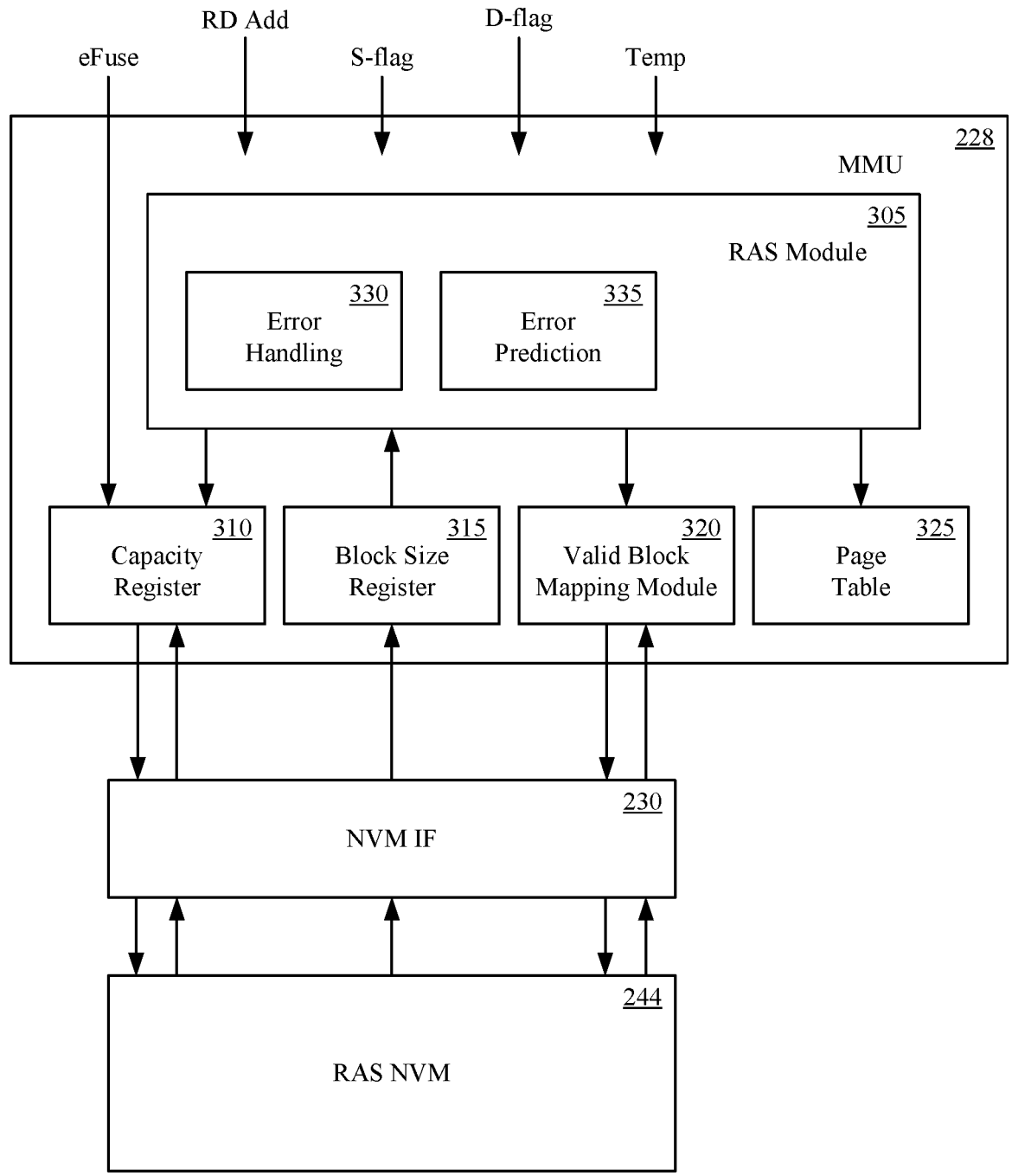
FIG. 3 shows a reliability availability serviceability (RAS) memory management unit (MMU), in accordance with aspects of the present technology.

Referring now to FIG. 3, a RAS MMU 228, in accordance with aspects of the present technology, is shown. The RAS MMU 228 can include a reliability availability serviceability (RAS) module 305, a capacity register 310, an optional block size register 315, a valid block mapping module 320 and a page table 325. The RAS module 305 can include an error handling module 330 and an error prediction module 335. The error handing module 330 can be configured to detect and manage memory errors based on the information from the eFuse register 216, the D-Flag register 222, the S-Flag register 238 and the read address buffer 236. The error prediction module 335 can be configured to predict memory errors based on temperature information from the temperature register 240 or optionally from the memory array temperature sensor 214.

In one implementation, the capacity register 310 can be configured to store a total number of usable memory blocks of the one or more memory dice 202. The total number of usable memory blocks of the one or more memory dice 202 can be read in from the RAS NVM 244. The capacity register can be set to a value of zero (0) if the value in the eFuse register 216 is in a given state indicating an entire VM block failure. In one implementation, the block size register 315 can be configured to store a smallest error handling granularity of the VM. For example, the block size register 315 can indicate that a hard error in a 64-bit memory access may disable access to an entire Kilobyte (KB) of DRAM. The smallest handling granularity of the VM can be read in from the RAS NVM 244. The total available VM capacity ($Capacity_{Total}$) of a memory die can be calculated as $Capacity_{Total} = Value_{capacity\_reg} * Value_{block\_size}$.

In one implementation, the valid block mapping module 320 can be configured to store a map of currently available VM block addresses. In a first example, the valid block mapping module 320 can store a bit map for all VM blocks of a memory die 202. In a second example, the valid mapping module 320 can store a list of failure block addresses. The valid block mapping information can be read in from the RAS NVM 244. In one implementation, the values of the capacity register and the valid block mapping information can be changed during runtime, and should be written back to the RAS NVM 244 before power down or periodically during runtime. The block size register can be read only, and may not be changed during runtime.

Figure 4:
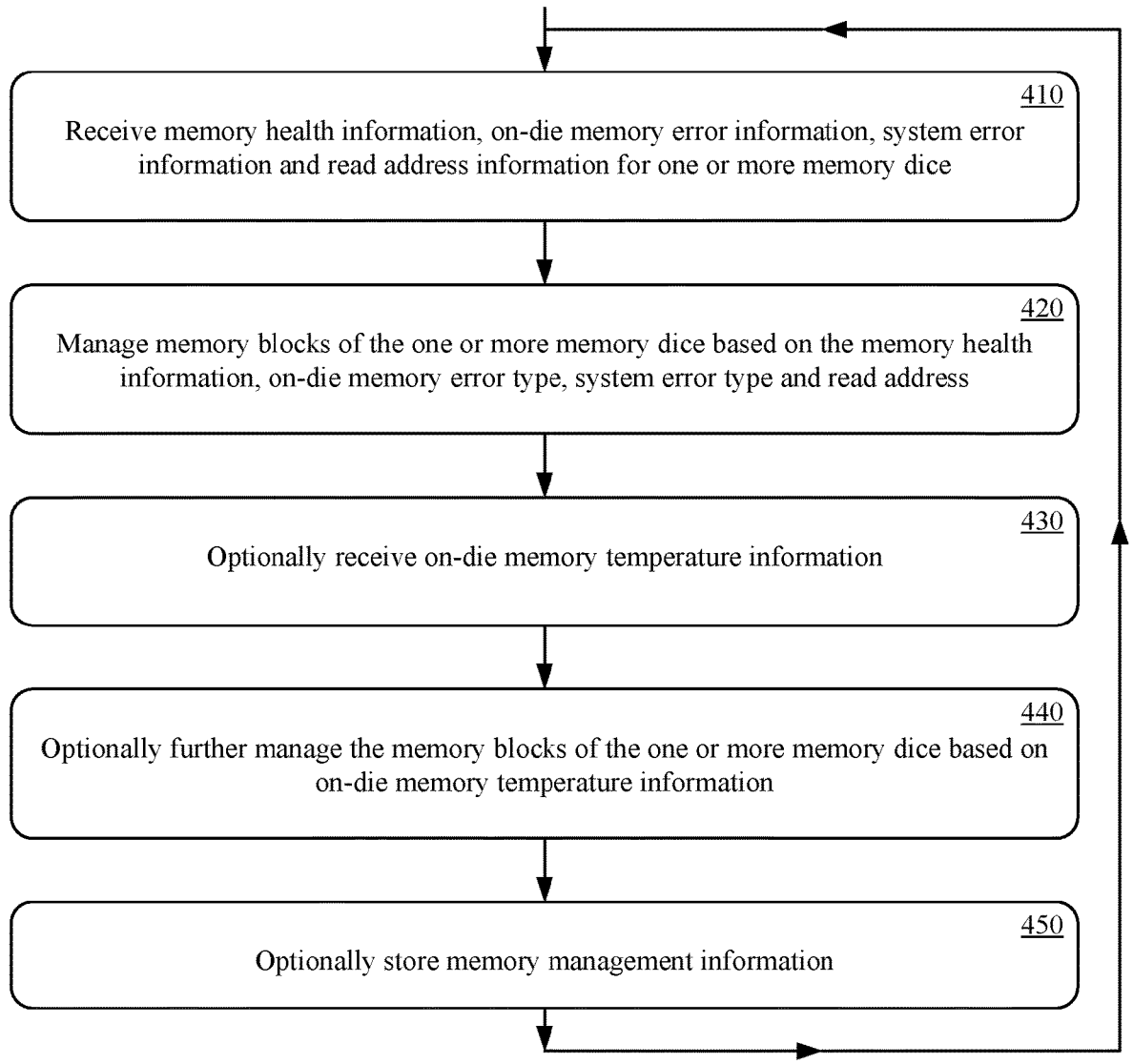
FIG. 4 shows a method of error detection, prediction and handling, in accordance with aspects of the present technology.

Operation of the SiP 200 is further explained herein with reference to FIG. 4, which shows a method of error detection, prediction and handling in accordance with aspects of the present technology. The method can include receiving memory health information, on-die memory error information, system error information and read address information, at 410. The memory health information, on-die memory error information, system error information and read address information, for one or more memory dice of the SiP can be received by the RAS MMU 228 of the logic die 204. In one implementation, the RAS MMU 228 can read health information of a respective memory die from a respective eFuse 216. The RAS MMU 228 can also read on-die ECC information from the D-Flag register 222 of the VM read control logic 212. The RAS MMU 228 can also read system ECC information from the S-Flag register 238. The RAS MMU 228 can also read the address of a pending read operation from the read address buffer 236.

At 420, memory blocks of the one or more memory dice can be managed based on the memory health information, on-die memory error information, system error information and read address information. In one implementation, RAS MMU 228 can manage the memory blocks of the memory using the received the memory health information, on-die memory error information, system error information and read address information.

At 430, on-die memory temperature information can optionally be received. In one implementation, the RAS MMU 228 can optionally receive on-die memory temperature information of the one or more memory dice. At 440, the memory blocks of the one or more memory dice can be further managed based the on-die memory temperature information. In one implementation, the RAS MMU 228 can manage the memory blocks of the memory based on the prediction of errors using the on-die memory temperature information of the one or more memory dice. At 450, memory management information can optionally be stored for subsequent use in managing the memory blocks of the one or more memory dice. In one implementation, the RAS MMU 228 can store memory management information including, but not limited to, memory health information, on-memory die memory error information, system error information and read address information, on-die memory temperature information of the one or more memory dice and or system temperature information of the logic die. In one implementation, the RAS MMU 228 can store the memory management information in an optional RAS non-volatile memory external or internal to the SiP. Alternatively, the RAS MMU 228 can provide the memory management information to a host 442. In addition, the processes at 410-450 can be iteratively performed for a plurality of memory accesses.

Figure 5:
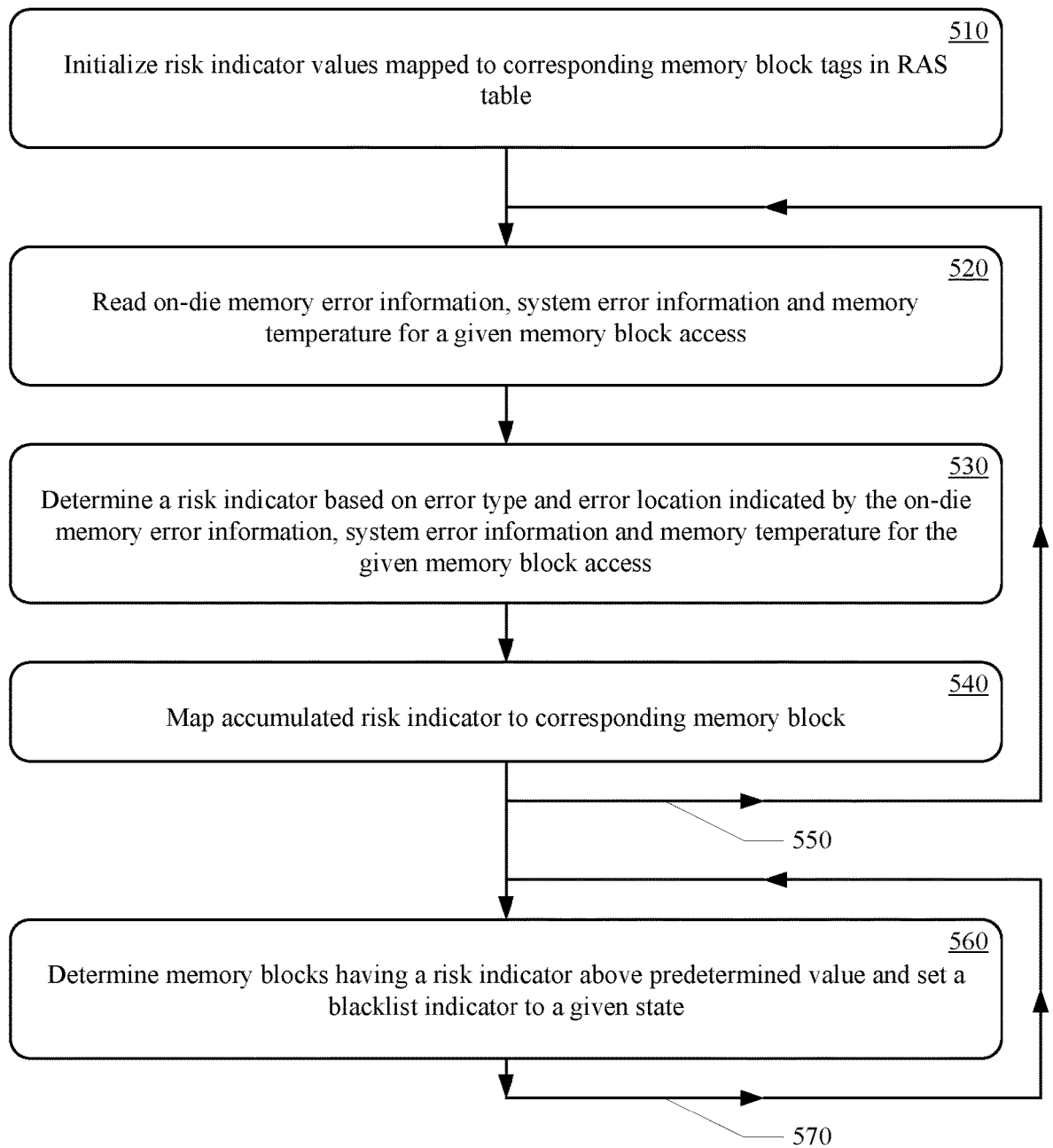
FIG. 5 shows a method of managing memory blocks of one or more memory dice in a SiP, in accordance with aspects of the present technology.

Referring now to FIG. 5, a method of managing memory blocks of one or more memory dice in a SiP, in accordance with aspects of the present technology, is shown. The method can include initializing risk indicator for corresponding memory blocks of one or more memory dice, at 510. In one implementation, the RAS MMU 228 can initialize risk indicator values mapped to corresponding memory block tags in a RAS table by setting the risk indicator values to zero.

At 520, the on-die memory error information and system error information can be read. In addition, on-die memory temperature can also be read. In one implementation, the RAS MMU 228 can read OD-ECC information in the D-Flag register 222, system-ECC information in the S-Flag register 238, and optionally the temperature register 240 or the memory array temperature sensor 214. At 530, a given risk indicator can be determined based on an error type and error location indicated by the on-die memory error information and system error information. The given risk indicator can also be further determined based on the optional memory array temperature. In one implementation, a risk indicator value can be associated with each detected memory error for a given location and a given error type. For example, a first error value a can be associated with a correctable error type detected on the memory die as indicated by the D-Flag register 222, a second error value b can be associated with an un-correctable error type detected on the memory die as indicated by the D-Flag register 222, a third error value c can be associated with an correctable error type detected on the system as indicated by the S-Flag register 238, a fourth error value d can be associated with an un-correctable error type detected on the system as indicated by the S-Flag register 238. In one implementation, the fourth error value d can be set to greater than or equal to a predetermined threshold value. In one example, the first error value a can be less than the second error value b, the second error value b can be less than the third error value c, and the third error value c can be less than the fourth error value d. Optionally, the error values can be multiplied by a temperature compensation scalar (T) based on the optional memory temperature and or a system temperature to decouple memory errors caused by temperature. Table 1 illustrates exemplary error location, error type and risk indicators.

| Flags | Error Location | Error Type | Risk Indicator |
|---|---|---|---|
| D-Flag-CE | On-Die Memory | Correctable | RI = + a · T |
| D-Flag-CE | On-Die Memory | Uncorrectable | RI = + b · T |
| S-Flag-CE | System | Correctable | RI = + c · T |
| S-Flag-CE | System | Uncorrectable | RI > threshold |

Accumulated risk indicators can be mapped to corresponding memory block, at 540. In one implementation, the RAS MMU 228 can map accumulated risk indicator values to corresponding virtual memory block tags in a RAS table. The processes at 520-540 can be iteratively performed for a plurality of memory accesses, at 550.

At 560, memory blocks having a risk indicator greater than or equal to the threshold value can be determine and identified as inaccessible. In one implementation, the RAS MMU 228 can determine memory blocks in the RAS table having a set (1) most-significant-bit (MSB) and can set a blacklist indicator in the RAS table for the given memory blocks. The process at 560 can be iteratively performed for each of a plurality of memory accesses, repeated at specified time intervals, or the like, at 570.

Figure 6:
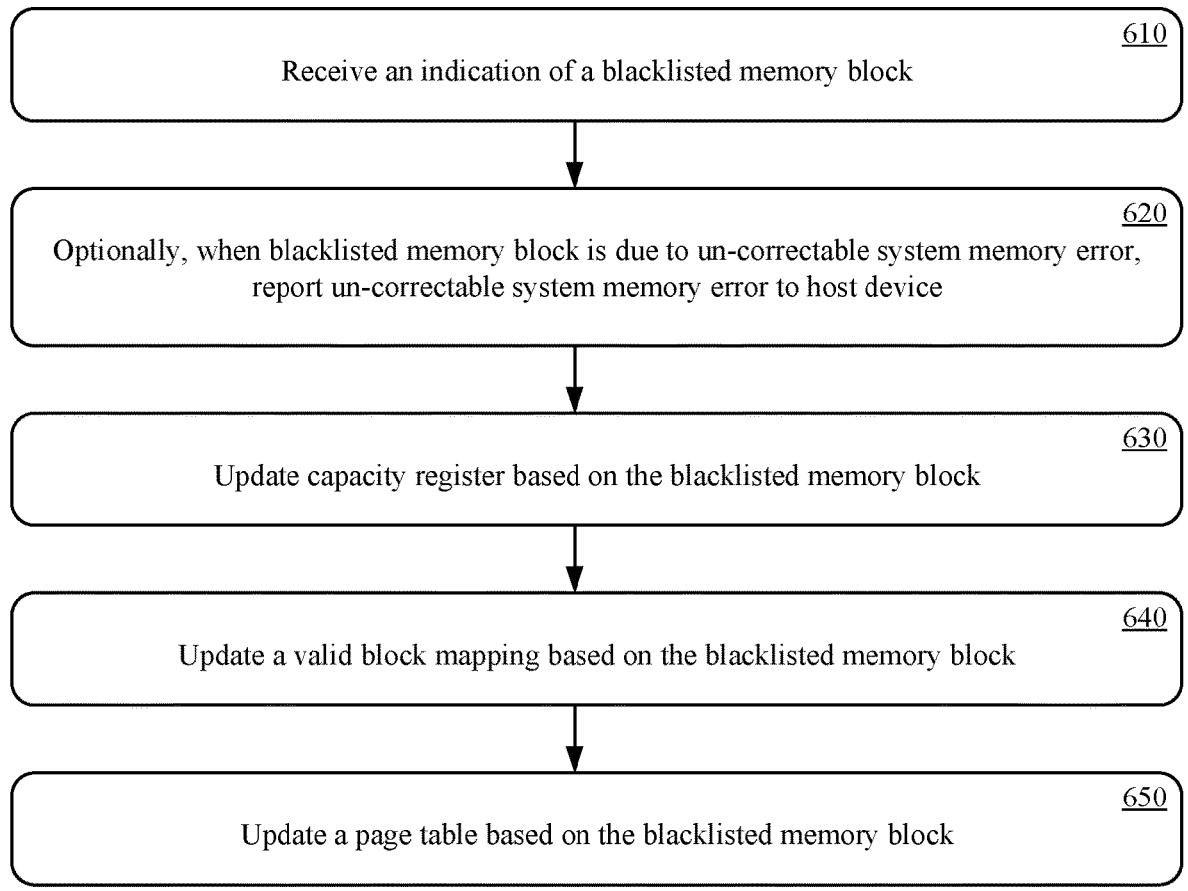
FIG. 6 shows a method of processing blacklisted memory blocks, in accordance with aspects of the present technology.

Referring not to FIG. 6, a method of processing blacklisted memory blocks, in accordance with aspects of the present technology, is shown. The method 600 can include receiving an indication of a blacklisted memory block, at 610. In one implementation, the RAS MMU 228 can determine a blacklisted memory block from the RAS table mapping risk indicator values to corresponding virtual memory block tags. When a given memory block is blacklisted due to an un-correctable system error, the un-correctable system error can optionally be reported to a host device, at 620. In one implementation, the RAS MMU 228 can report the un-correctable system error to the host 442. At 630, a capacity register can be updated based on a blacklisted memory block. In one implementation, the RAS MMU 228 can update the capacity register 310 in response to receiving the indication of a given blacklisted memory block. At 640, a mapping of valid blocks can be updated based on the blacklisted memory block. In one implementation, the valid block mapping module 320 of the RAS MMU 228 can update a mapping of valid memory blocks in response to receiving the indication of a given blacklisted memory block. At 650, a page table can be updated based on the blacklisted memory block. In one implementation, the RAS MMU 228 can update the page table 325 by setting a page table entry valid indication for a corresponding memory block in response to receiving the indication of a given blacklisted memory block.

The memory error detection, error prediction and error handling mechanism, in accordance with aspects of the present technology, can advantageously utilized in processing-in-memory (PIM), processing-near-memory (PNM) and other similar architectures. The memory error detection, prediction and handling mechanism is advantageously suited for error tolerant applications. Because bit error rates in volatile memory can become a significant issue in various dice bonding technologies for system-in-package, aspects of the present error detection, error prediction and error handling mechanism can advantageously provide cost and or yield improvements for volatile memory (VM) in PIM, PNM or similar SiP architectures.

The following examples pertain to specific technology embodiments and point out specific features, elements, or steps that may be used or otherwise combined in achieving such embodiments.

Example 1 includes a system-in-package (SiP) comprising: one or more memory dice including; a memory array arranged in a plurality of blocks; an electronic fuse (eFuse) module configured to store memory health information of the one or more memory dice; and a memory error correcting code (ECC) flag register configured to store on-die memory error information of the one or more memory dice; and a logic die including; computation logic; a memory controller configured to communicatively couple the computation logic to the one or more memory dice, wherein the memory controller includes a system error correcting code (ECC) flag register configured to store system memory error information and a read address buffer configured to store memory read addresses; and a reliability availability serviceability (RAS) memory management unit (MMU) configured to communicatively couple the memory controller to a host, wherein the RAS MMU is configured to manage memory error detection, memory error prediction and memory error handling based on the eFuse module, the memory error correcting code (ECC) flag register, the system error correcting code (ECC) flag register and the read address buffer.

Example 2 includes the SiP of Example 1, wherein the logic die further includes: a non-volatile memory interface configured to communicatively couple a RAS non-volatile memory configured to store memory management information to the RAS MMU.

Example 3 includes the SiP of Example 1, wherein: the one or more memory dice include a temperature sensor; the memory controller further includes a temperature register; and the RAS MMU is further configured to manage the memory error detection memory error prediction and memory error handling based on temperature information from the temperature sensor of one or more memory dice or the temperature register of the memory controller.

Example 4 includes the SiP of Example 1, wherein a first state of the memory error correcting code (ECC) flag register indicates a correctable error and a second state indicates an uncorrectable error.

Example 5 includes the SiP of Example 1, wherein a first state of the system error correcting code (ECC) flag register indicates a correctable error and a second state indicates an uncorrectable error.

Example 6 includes the SiP of Example 1, wherein the RAS MMU configured to manage the memory error detection, memory error prediction and memory error handling includes blacklisting a memory block in one or more memory dice when a corresponding risk indicator reaches a predetermined level.

Example 7 includes the SiP of Example 1, wherein the RAS MMU includes: an error handling module configured to detect and manage memory errors based on the information from the eFuse module, the memory error correcting code (ECC) flag register, the system error correcting code (ECC) flag register and the read address buffer; an error prediction module configured to predict memory errors based on temperature information from the temperature register of the memory controller or the temperature sensor of the one or more memory dice; a capacity register configured to configured to store a total number of usable memory blocks of the one or more memory dice; a block size register configured to store a smallest error handling granularity; and a valid block mapping module configured to store a mapping of risk indicators to corresponding ones of the plurality of blocks of the memory array.

Example 8 includes the SiP of Example 1, wherein the logic die and the one or more memory die are arranged in a processing-near-memory (PNM), a two-dimensional (2D) PNM, 2.5D PNM, processing-in-memory (PIM), 2D PIM, three-dimensional (3D) Hybrid (HB) PNM, 3D through-silicon-via (TSV) PNM architecture.

Example 9 includes a method of managing memory error detection, memory error prediction and memory error handling comprising: receiving, by a memory management unit (MMU) of a logic die in a system-in-package (SIP), memory health information, on-die memory error information, system error information and read address information for one or more memory dice in the SIP; and managing, by the MMU, memory blocks of the one or more memory dice based on the memory health information, on-die memory error type, system error type and read address.

Example 10 includes the method according to Example 9, further comprising: receiving, by the MMU, one or more of on-die memory temperature information; and managing, by the MMU, the memory blocks of the one or more memory dice based on one or more of the on-die memory temperature information.

Example 11 includes the method according to Example 9, further comprising storing, by the MMU, memory management information.

Example 12 includes the method according to Example 9, further comprising: reading, by the MMU, on-die memory error information, system error information, memory temperature for a given memory block access; determining, by the MMU, a risk indicator based on error type and error location indicated by the on-die memory error information, system error information, memory temperature for the given memory block access; and mapping, by the MMU, an accumulated risk indicator to corresponding memory block.

Example 13 includes the method according to Example 12, further comprising: determining, by the MMU, memory blocks having a risk indicator above predetermined value and setting a blacklist indicator to a given state.

Example 14 includes the method according to Example 13, further comprising: receiving, by the MMU, an indication of a blacklisted memory block; updating, by the MMU, a capacity register based on blacklisted memory block; updating, by the MMU, a valid block mapping based on blacklisted memory block; and updating, by the MMU, a page table based on the blacklisted memory block.

Example 15 includes the method according to Example 14, further comprising: reporting by the MMU to a host, an un-correctable system memory error when a memory block is blacklisted due to the un-correctable system memory error.

Example 16 includes a system comprising: a host; a reliability availability serviceability (RAS) non-volatile memory (NVM); and a system-in-package (SIP). The SIP includes one or more memory dice and a logic die. The one or more memory dice include: a memory array arranged in a plurality of blocks; an electronic fuse (eFuse) module configured to store memory health information of the one or more memory dice; and a D-Flag register configured to store on-die memory error information of the one or more memory dice. The logic die includes; computation logic; a memory controller configured to communicatively couple the computation logic to the one or more memory dice, wherein the memory controller includes a S-Flag register configured to store system memory error information and a read address buffer configured to store memory read addresses; a RAS memory management unit (MMU) configured to communicatively couple the memory controller to a host, wherein the RAS MMU is configured to manage memory error detection, memory error prediction and memory error handling based on the memory health information, the on-die memory error information, the system memory error information and the memory read addresses; and a non-volatile memory interface communicatively coupling to the RAS MMU to the RAS non-volatile memory.

Example 17 includes the system of Example 16, wherein the RAS NVM is configured to store memory management information.

Example 18 includes the system of Example 16, wherein: the one or more memory dice include a temperature sensor; the memory controller further includes a temperature register; and the RAS MMU is further configured to manage the memory error detection memory error prediction and memory error handling based on temperature information from the temperature register of the memory controller or the temperature sensor of the one or more memory dice.

Example 19 includes the system of Example 16, wherein the RAS MMU is configured to manage the memory error detection, memory error prediction and memory error handling includes blacklisting a memory block in one or more memory dice when a corresponding risk indicator reaches a predetermined level.

Example 20 includes the system of Example 16, wherein the RAS MMU includes: an error handling module configured to detect and manage memory errors based on the information from the memory health information, the on-die memory error information, the system memory error information and the memory read addresses; an error prediction module configured to predict memory errors based on temperature information from the temperature register of the memory controller or the temperature sensor of the one or more memory dice; a capacity register configured to configured to store a total number of usable memory blocks of the one or more memory dice; a block size register configured to store a smallest error handling granularity; and a valid block mapping module configured to store a mapping of risk indicators to corresponding ones of the plurality of blocks of the memory array.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A system-in-package (SiP) comprising:
one or more memory dice including:
a memory array arranged in a plurality of blocks;
an electronic fuse (eFuse) module configured to store memory health information of the one or more memory dice; and
a memory error correcting code (ECC) flag register configured to store on-die memory error information of the one or more memory dice; and
a logic die including:
computation logic;
a memory controller configured to communicatively couple the computation logic to the one or more memory dice, wherein the memory controller includes a system error correcting code (ECC) flag register configured to store system memory error information and a read address buffer configured to store memory read addresses; and
a reliability availability serviceability (RAS) memory management unit (MMU) configured to communicatively couple the memory controller to a host, wherein the RAS MMU is configured to manage memory error detection, memory error prediction and memory error handling based on the eFuse module, the memory error correcting code (ECC) flag register, the system error correcting code (ECC) flag register and the read address buffer.

2. The SiP of claim 1, wherein the logic die further includes:
a non-volatile memory interface configured to communicatively couple a RAS non-volatile memory configured to store memory management information to the RAS MMU.

3. The SiP of claim 1, wherein:
the one or more memory dice include a temperature sensor;
the memory controller further includes a temperature register; and
the RAS MMU is further configured to manage the memory error detection memory error prediction and memory error handling based on temperature information from the temperature sensor of one or more memory dice or the temperature register of the memory controller.

4. The SiP of claim 1, wherein a first state of the memory error correcting code (ECC) flag register indicates a correctable error and a second state indicates an uncorrectable error.

5. The SiP of claim 1, wherein a first state of the system error correcting code (ECC) flag register indicates a correctable error and a second state indicates an uncorrectable error.

6. The SiP of claim 1, wherein the RAS MMU configured to manage the memory error detection, memory error prediction and memory error handling includes blacklisting a memory block in one or more memory dice when a corresponding risk indicator reaches a predetermined level.

7. The SiP of claim 1, wherein the RAS MMU includes:
an error handling module configured to detect and manage memory errors based on the information from the eFuse module, the memory error correcting code (ECC) flag register, the system error correcting code (ECC) flag register and the read address buffer;
an error prediction module configured to predict memory errors based on temperature information from the temperature register of the memory controller or the temperature sensor of the one or more memory dice;
a capacity register configured to store a total number of usable memory blocks of the one or more memory dice;
a block size register configured to store a smallest error handling granularity; and
a valid block mapping module configured to store a mapping of risk indicators to corresponding ones of the plurality of blocks of the memory array.

8. The SiP of claim 1, wherein the logic die and the one or more memory die are arranged in a processing-near-memory (PNM), a two-dimensional (2D) PNM, 2.5D PNM, processing-in-memory (PIM), 2D PIM, three-dimensional (3D) Hybrid (HB) PNM, 3D through-silicon-via (TSV) PNM architecture.

9. A method of managing memory error detection, memory error prediction and memory error handling comprising:
receiving, by a memory management unit (MMU) of a logic die in a system-in-package (SIP), memory health information, on-die memory error information, system error information and read address information for one or more memory dice in the SIP; and
managing, by the MMU, the memory error detection, memory error prediction and memory error handling based on the memory health information, on-die memory error information, system error information and read address information.

10. The method according to claim 9, further comprising:
receiving, by the MMU, one or more of on-die memory temperature information; and
managing, by the MMU, the memory blocks of the one or more memory dice based on one or more of the on-die memory temperature information.

11. The method according to claim 9, further comprising storing, by the MMU, memory management information.

12. The method according to claim 9, further comprising:
reading, by the MMU, on-die memory error information, system error information, memory temperature for a given memory block access;
determining, by the MMU, a risk indicator based on error type and error location indicated by the on-die memory error information, system error information, memory temperature for the given memory block access; and
mapping, by the MMU, an accumulated risk indicator to corresponding memory block.

13. The method according to claim 12, further comprising:
determining, by the MMU, memory blocks having a risk indicator above a predetermined value and setting a blacklist indicator to a given state.

14. The method according to claim 13, further comprising:
receiving, by the MMU, an indication of a blacklisted memory block;
updating, by the MMU, a capacity register based on blacklisted memory block;
updating, by the MMU, a valid block mapping based on blacklisted memory block; and
updating, by the MMU, a page table based on the blacklisted memory block.

15. The method according to claim 14, further comprising:
reporting by the MMU to a host, an un-correctable system memory error when a memory block is blacklisted due to the un-correctable system memory error.

16. A system comprising:
a host;
a reliability availability serviceability (RAS) non-volatile memory (NVM); and
a system-in-package (SIP) including:
one or more memory dice including:
a memory array arranged in a plurality of blocks;
an electronic fuse (eFuse) module configured to store memory health information of the one or more memory dice; and
a D-Flag register configured to store on-die memory error information of the one or more memory dice; and
a logic die including:
computation logic;
a memory controller configured to communicatively couple the computation logic to the one or more memory dice, wherein the memory controller includes an S-Flag register configured to store system memory error information and a read address buffer configured to store memory read addresses;
a RAS memory management unit (MMU) configured to communicatively couple the memory controller to a host, wherein the RAS MMU is configured to manage memory error detection, memory error prediction and memory error handling based on the memory health information, the on-die memory error information, the system memory error information and the memory read addresses; and
a non-volatile memory interface communicatively coupling to the RAS MMU to the RAS non-volatile memory.

17. The system of claim 16, wherein the RAS NVM is configured to store memory management information.

18. The system of claim 16, wherein:
the one or more memory dice include a temperature sensor;
the memory controller further includes a temperature register; and
the RAS MMU is further configured to manage the memory error detection, memory error prediction and memory error handling based on temperature information from the temperature register of the memory controller or the temperature sensor of the one or more memory dice.

19. The system of claim 16, wherein the RAS MMU configured to manage the memory error detection, memory error prediction and memory error handling further includes blacklisting a memory block in one or more memory dice when a corresponding risk indicator reaches a predetermined level.

20. The system of claim 16, wherein the RAS MMU includes:
- an error handling module configured to detect and manage memory errors based on the information from the memory health information, the on-die memory error information, the system memory error information and the memory read addresses;
- an error prediction module configured to predict memory errors based on temperature information from the temperature register of the memory controller or the temperature sensor of the one or more memory dice;
- a capacity register configured to store a total number of usable memory blocks of the one or more memory dice;
- a block size register configured to store a smallest error handling granularity; and
- a valid block mapping module configured to store a mapping of risk indicators to corresponding ones of the plurality of blocks of the memory array.

* * * * *